United States Patent [19]
Pio

[11] Patent Number: 6,115,313
[45] Date of Patent: Sep. 5, 2000

[54] METHOD FOR SAVING DATA IN THE EVENT OF UNWANTED INTERRUPTIONS IN THE PROGRAMMING CYCLE OF A NONVOLATILE MEMORY, AND A NONVOLATILE MEMORY

[75] Inventor: Federico Pio, Brugherio, Italy

[73] Assignee: STMicroelectronics S.r.l., Agrate Brianza, Italy

[21] Appl. No.: 09/302,231

[22] Filed: Apr. 29, 1999

[30] Foreign Application Priority Data

Apr. 30, 1998 [EP] European Pat. Off. .............. 98830265

[51] Int. Cl.[7] ...................................................... G11C 7/00
[52] U.S. Cl. ...................................... 365/228; 365/185.33
[58] Field of Search .................................. 365/226, 227, 365/228, 185.22, 185.33, 185.01

[56] References Cited

U.S. PATENT DOCUMENTS

| | | | |
|---|---|---|---|
| 4,800,533 | 1/1989 | Arakawa | 365/228 |
| 5,414,671 | 5/1995 | Fukumoto | 365/228 |

FOREIGN PATENT DOCUMENTS

0 630 027A1 12/1994 European Pat. Off. .
WO 97/48100 12/1997 WIPO .

Primary Examiner—Vu A. Le
Attorney, Agent, or Firm—Theodore E. Galanthay; E. Russell Tarleton; Seed IP Law Group PLLC

[57] ABSTRACT

A method for saving and restoring data in the event of unwanted interruption of programming, the control logic unit of the memory controls writing of the data that would otherwise be lost and its address, in an appropriate backup memory location. To this end, the backup memory location is maintained erased, such as to allow immediate writing of the data and its address, in case of interruption of programming. To guarantee functioning even in the absence of an external supply, appropriate charge accumulators are provided, which can guarantee availability of a write-only cycle. As soon as a voltage drop is detected, the operations in progress are interrupted, and the backup operations for the data being programmed are activated; when the memory is switched on again, it is verified whether an interruption of the writing cycle has previously occurred, and thus the data saved can be recovered into the main memory.

30 Claims, 5 Drawing Sheets

METHOD FOR SAVING DATA IN THE EVENT OF UNWANTED INTERRUPTIONS IN THE PROGRAMMING CYCLE OF A NONVOLATILE MEMORY, AND A NONVOLATILE MEMORY

TECHNICAL FIELD

The present invention relates to a method for saving data in case of unwanted interruptions in the programming cycle of a nonvolatile memory, and a nonvolatile memory.

BACKGROUND OF THE INVENTION

As is known, the programming cycle of a nonvolatile memory, for example an EEPROM, to which reference will be made hereinafter without limiting thereto, comprises a plurality of steps including supplying data to be written and corresponding addresses, addressing the portion (line) of the memory to be programmed, erasing data previously stored in this memory portion, and writing new data. If programming is interrupted during the last two steps (erasing and writing), for example for a sudden drop in the supply voltage, depending on the exact moment when this occurs, there may be loss of the new data being programmed, or possibly even old data previously contained in the addressed memory portion. This loss can cause problems when the memory attempts to resume writing or subsequently when reading the incorrect content of the memory portion in which the problem occurred.

SUMMARY OF THE INVENTION

One aspect of the invention is to ensure proper programming of a nonvolatile memory even if there is an interruption during the program cycle. Another aspect is to have the data being programmed saved in a backup location. A further aspect is that the programming can be ended correctly after an interruption condition, when the causes of malfunctioning cease.

The present invention provides a method for saving data in the event of unwanted interruptions in the programming cycle of a nonvolatile memory, and a nonvolatile memory.

BRIEF DESCRIPTION OF THE DRAWINGS

For understanding the present invention, a preferred embodiment is now described, purely by way of nonlimiting example, with reference to the attached drawings, in which.

DETAILED DESCRIPTION OF THE INVENTION

According to the following detailed description, the present method is based on the idea of providing an appropriate circuit which, in case of unwanted interruption of the programming cycle, writes the content of data which otherwise would be lost and its address, in an appropriate saving memory location, such that, when the memory is reactivated, the data can be recovered. The saving memory location can advantageously be an array row kept deliberately erased, to allow data to be written there immediately in case of interruption of programming; the address of saved data in the memory array can then be stored in this saving memory location, corresponding to the columns used for redundancy in the remainder of the array. As an alternative, an appropriate memory area can be provided, which can also be separated from the memory array. To guarantee functioning even in the absence of an external supply, appropriate load accumulators are provided (capacitors biased to a predetermined voltage value) which can guarantee availability of a write-only cycle. There can also be present:

An element that identifies the event, allows interruption of the operations in progress and starts backup operations for the data being programmed;

a memory location in which addresses of data being programmed can be stored;

a possibility of checking from the exterior if an interruption of writing has occurred, and thus recovering the data into the main memory.

Hereinafter an embodiment of the invention is described wherein, upon the programming cycle being interrupted, a memory row called hereinafter as backup memory stores data being programmed, its address, and an error code, the binary value of which shows that an interruption has occurred. In particular, in the example described, before each datum is written, the present content of the addressed row is read and is stored in a temporary memory; the datum being programmed is overwritten in the temporary memory and in latches of the memory array; if programming is interrupted, the content of the temporary memory is transferred to the backup memory, with the error code.

Figure 1:
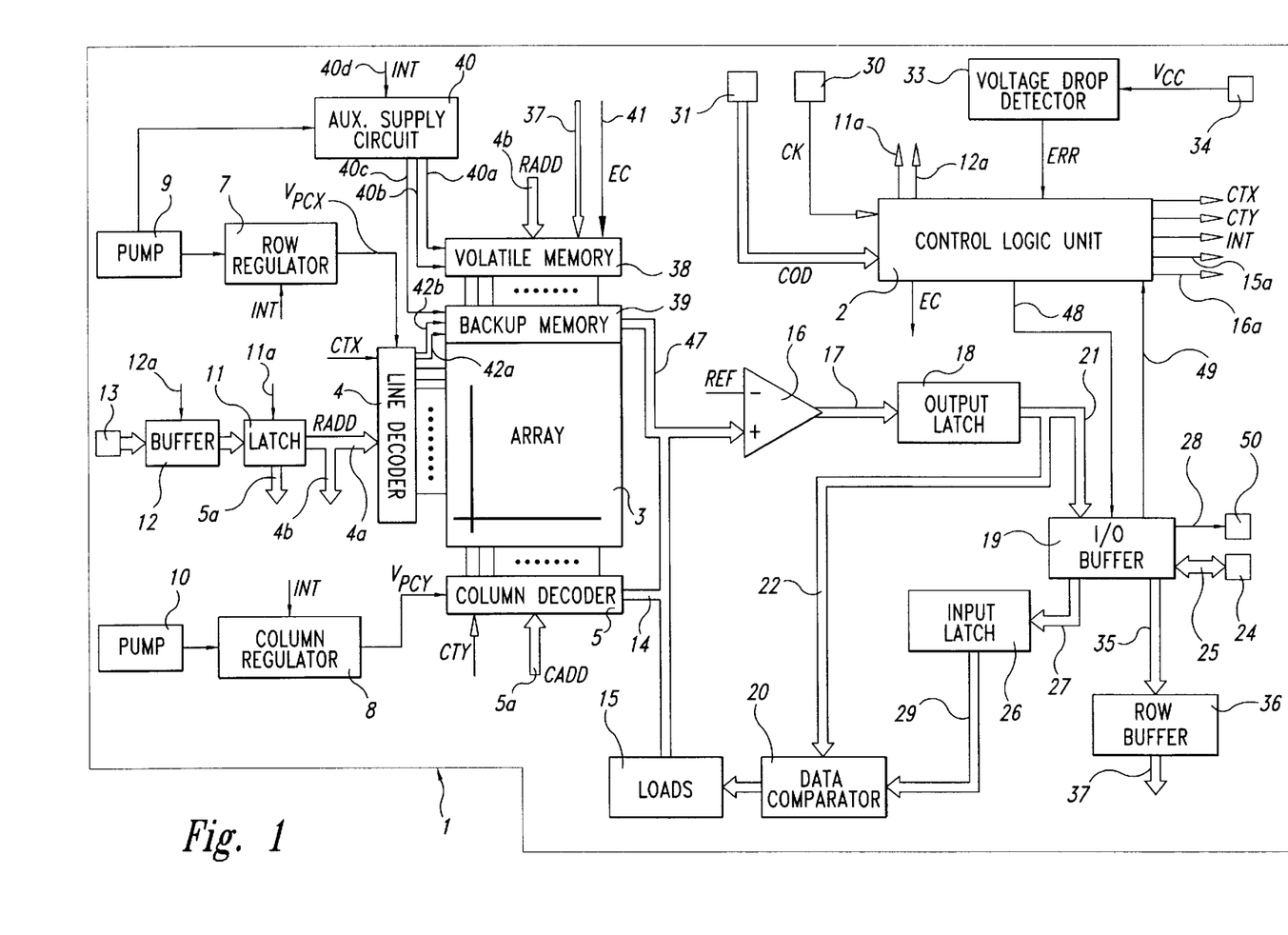
FIG. 1 is a simplified block diagram of a nonvolatile memory according to the invention.

In detail, in FIG. 1, a nonvolatile memory (of which only the parts which are essential for understanding the present invention are shown and described) comprises a control logic unit 2, typically a state machine, which receives from the interior or from the exterior, on appropriate pads 30, 31, a clock signal CK, and an operative code COD with several bits, and exchanges a plurality of signals and controls with the components of memory 1 itself, as described in detail hereinafter.

In a known manner, memory 1 comprises an array 3 of memory cells that are addressed by a row decoder 4 and a column decoder 5 that receive respective address signals RADD and CADD supplied to respective buses 4a and 5a, and control signals CTX and CTY, from control logic unit 2. Row decoder 4 and column decoder 5 receive respective write voltages VPCX and VPCY from a respective row regulator 7 and column regulator 8, which in turn are connected to respective charge pumps 9 and 10. Regulators 7 and 8 receive an interruption signal INT from control logic unit 2 (low active), when a condition is detected which prevents continuation of programming; interruption signal INT causes switching off regulators 7, 8 themselves, when it switches from a high state to a low state.

Bus 4a supplying row address signals RADD to row decoder 4, and bus 5a supplying column address signals CADD to column decoder 5, are connected to an address latch 11 that in turn receives the row address signals from an address buffer 12 which is connected to the exterior by a pad 13. Address latch 11 and address buffer 12 receive respective control signals from control logic unit 2 through respective lines 11a and 12a. As an alternative, the row address signals can be transmitted to address latch 11 by a data input/output pad and an input/output buffer having own control line (elements 19 and 24 and line 48, described in detail hereinafter).

Column decoder 5 is connected via a data bus 14 to a program load unit 15 and to a first input of a reading unit or sense amplifiers 16, the other input of which receives a reference signal REF. The output of sensing amplifiers 16 is connected via a data bus 17 to an output latch unit 18, which in turn is connected to an I/O buffer 19, and to a data comparison unit 20, via respective buses 21 and 22; I/O buffer 19 is connected to the exterior by input/output pads 24, via a bus 25 and an input latch unit 26, via a bus 27. In turn, input latch unit 23 is connected to the data comparison unit 20 via a bus 29.

As shown in FIG. 1, a voltage drop detection device 33 is connected to the exterior via a pad 34 (normally) fed with supply voltage Vcc, and can generate an error signal ERR when supply voltage Vcc drops below a predetermined value. Voltage drop detection device 33 can be made in any known manner; for example it can comprise substantially a comparator, receiving at one input supply voltage Vcc, and at another input a reference value that is stable and substantially independent from the supply voltage.

Figure 2:
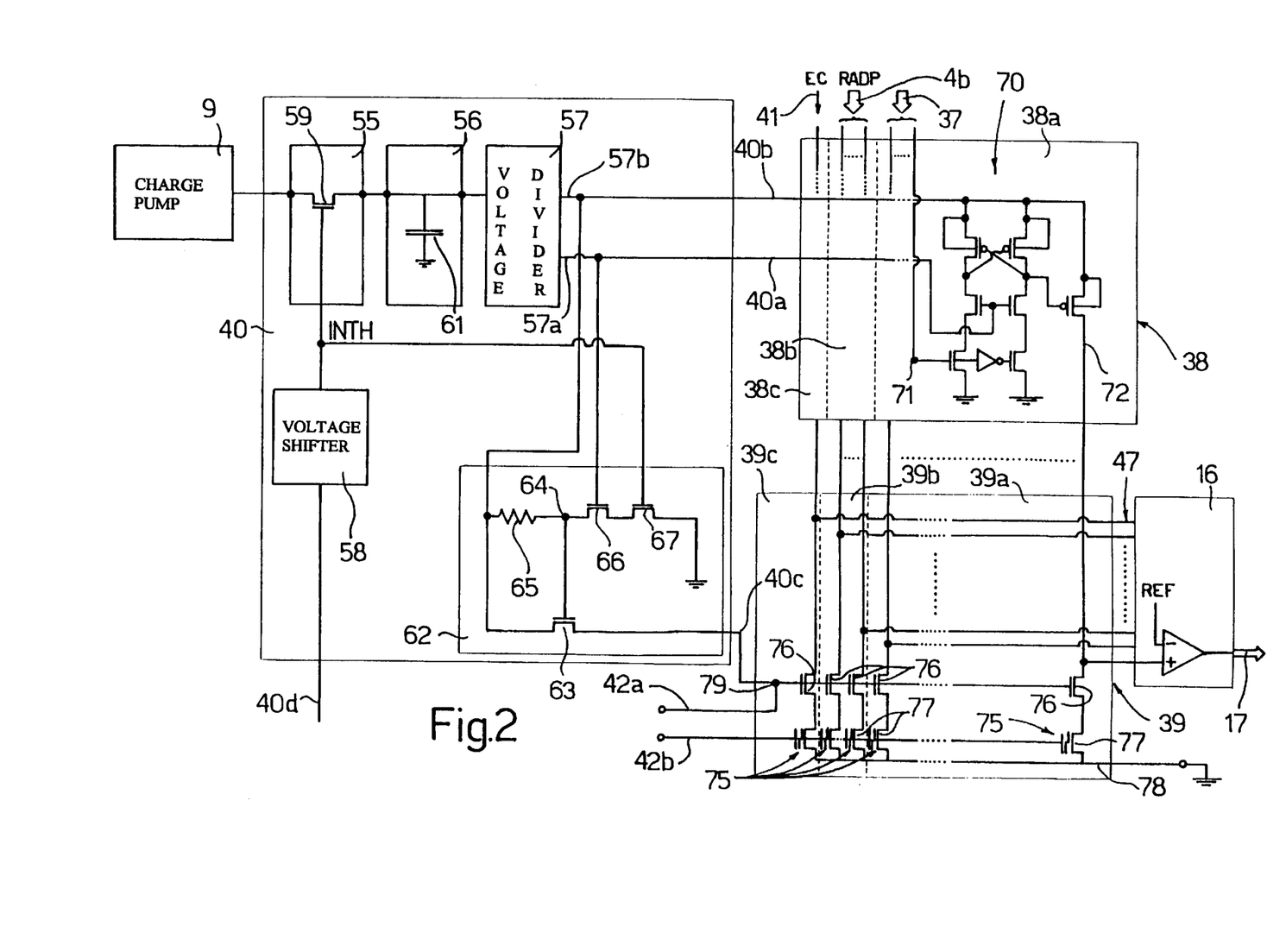
FIG. 2 is a more detailed diagram of the blocks of FIG. 1, intervening for saving data upon unwanted interruption of the programming cycle.

In addition, I/O buffer 19 is connected, via a bus 35, to a row buffer 36, which in turn is connected, via a bus 37, to a temporary memory 38 including latch circuits (see FIG. 2). Temporary memory 38 also receives the row addresses RADD on a bus 4b, branching from bus 4a, and an error code EC supplied by control logic unit 2 to a line 41. Temporary memory 38 is connected to a backup memory 39 of nonvolatile type, which, in the example in FIG. 1, is contained in a subsidiary area of memory array 3 itself. Error code EC is a binary signal, the state of which is indicative of the presence of data saved in backup memory 39, and for example has the value 0 if no data is saved, and 1 in the opposite case. Error code EC must thus be transferred from temporary memory 38 to backup memory 39 with the datum to be saved and its address, in the event programming being interrupted, as described hereinafter.

Both temporary memory 38 and backup memory 39 are connected to an auxiliary supply circuit 40 which has a low voltage output 40a (reading voltage of the memory 1) connected to temporary memory 38, and a first and second high voltage outputs 40b and 40c (set to a write voltage). Outputs 40b and 40c are connected respectively to temporary memory 38 and backup memory 39, and can supply high voltage necessary for writing backup memory 33, as described in detail with reference to FIG. 2. Auxiliary supply circuit 40 receives at one of its inputs 40d the interruption signal INT, and is connected to a charge pump, for example to row charge pump 9. In addition, backup memory 39 is connected to row decoder 4 via lines 42a and 42b supplying the required biasing voltages, analogously to other rows of memory array 3, according to the operative step of the memory, except data backup, as described hereinafter. Backup memory 39 is also connected to first input of the sense amplifier 16 via a data bus 47. Finally, control logic unit 2 is connected to I/O buffer 19 via a pair of lines 48, 49, for exchange of signals, and I/O buffer 19 is connected to an output pad 50, via a line 28.

FIG. 2 shows an embodiment of temporary memory 38, backup memory 39 and auxiliary supply circuit 40, wherein backup memory 39 is separated from memory array 3. In detail, auxiliary supply circuit 40 comprises a switch 55, a storing unit 56 and a voltage divider 57. Here, switch 55 comprises an NMOS transistor 59 arranged between row charge pump 9 and storing unit 56, and has a control terminal connected to input 40d. Input 40d receives an interruption signal INTH, obtained from interruption signal INT, and elevated via a voltage shifter 58. Storage unit 56 is preferably of capacitive type, and is shown schematically by a capacitor 61. Voltage divider 57 can be made in any known manner, and is preferably of a minimum consumption type (and therefore not of a resistive type). Voltage divider 57 has a first output 57a connected directly to low voltage output 40a, and a second output 57b connected directly to first high voltage 40b, and, via a switch unit 62, to second high voltage output 40c of auxiliary supply circuit.

Switch unit 62 comprises a biasing transistor 63 of the NMOS type, arranged between second output 57b of voltage divider 57 and second high voltage output 40c, and has a control terminal connected to a node 64. Node 64 is connected on one side to second output 57b of voltage divider 57 via a resistor 65, and on the other side to ground via two transistors 66, 67 of NMOS type. Transistor 66 is arranged between node 64 and transistor 67, and has a control terminal connected to first output 57a of voltage divider 57; transistor 67 has a control terminal connected to input 40d of auxiliary supply circuit 40, and has its source terminal connected to ground.

Temporary memory 38 comprises a plurality of latch circuits 70, only one of which is shown in FIG. 2. In particular, in the embodiment of FIG. 2, temporary memory 38 is divided into three parts, i.e., a first part 38a which comprises a number of latch circuits 70 equal to the number of cells of a row of the array 3, excluding redundancy (or of a sector of the latter, if the memory is divided into sectors), latch circuits 70 receiving data to be temporarily stored by bus 37; a second part 38b which comprises a plurality of latch circuits 70 (not shown) equal to the number of bits forming the address of the row in which the datum to be programmed must be stored, latch circuits 70 being connected to bus 4b; and a third part 38c which comprises a single latch circuit (not shown) connected to line 41 which supplies error code EC.

Each latch circuit 70 is preferably made as a voltage shifter of a known type shown in FIG. 2, and not described in detail. Latch circuit 70 is connected both to first output 57a and to second output 57b of voltage divider circuit 57, and has an input 71 connected to a respective line of bus 37, to receive the datum being programmed, and an output 72 supplying the output datum, inverted with respect to the datum received on input 71, and voltage-shifted with respect to the value supplied by second output 57b of voltage divider 57.

Outputs 72 of latch circuits 70 are connected to respective backup cells 75 of the EEPROM type, belonging to backup memory 39. Backup memory 39 is also divided into three parts, and specifically a first part 39a for storing data of the row to be written with the datum to be programmed (and thus comprising a number of backup cells 75 which is the same as the number of latch circuits 70 in part 38a), a second part 39b for storing the address of this row (and thus comprising a number of backup cells 75 that is the same as the number of latch circuits 70 in part 38b), and a third part for storing the error code, comprising a single backup cell 75.

In a known manner, each backup cell 75 comprises a selection transistor 76 and a memory transistor 77. Selection transistor 76 has a first terminal connected to output 72 of respective latch circuit 70, a second terminal connected to a first terminal of respective memory transistor 77 and a control terminal; all control terminals of selection transistors 76 are connected together to a node 79, connected both to the second high voltage output 40c, and to line 42a; second terminals of memory transistors 77 are connected to a common ground line 78, and the control terminals of memory transistors 77 are connected all to line 42b.

Operation of memory 1 and backup circuit in FIG. 2 is now described with reference to flow charts of FIGS. 3 and 4, taking into account that in normal conditions (i.e., during all operative steps of memory 1, except in case of sudden interruption of programming), auxiliary supply circuit is in a charging condition. In fact, normally, signals INT and INTH are high and switch 55 is closed, connecting charge pump 9 to storing unit 56 which charges to a predetermined write voltage.

Simultaneously, voltage divider 57 supplies low and high voltages to outputs 40a and 40b of temporary memory 38; on the other hand high voltage output 40c is floating. In fact, high signal INTH keeps NMOS transistor 67 switched on, which, owing also to the on state of NMOS transistor 66, connected to output 57a, connects control terminal of biasing transistor 63 to ground. Biasing transistor 63 is thus switched off, disconnecting output 40c from output 57a. In addition, as described hereinafter, normally, backup memory 40 is erased and does not store any datum.

Figure 3:
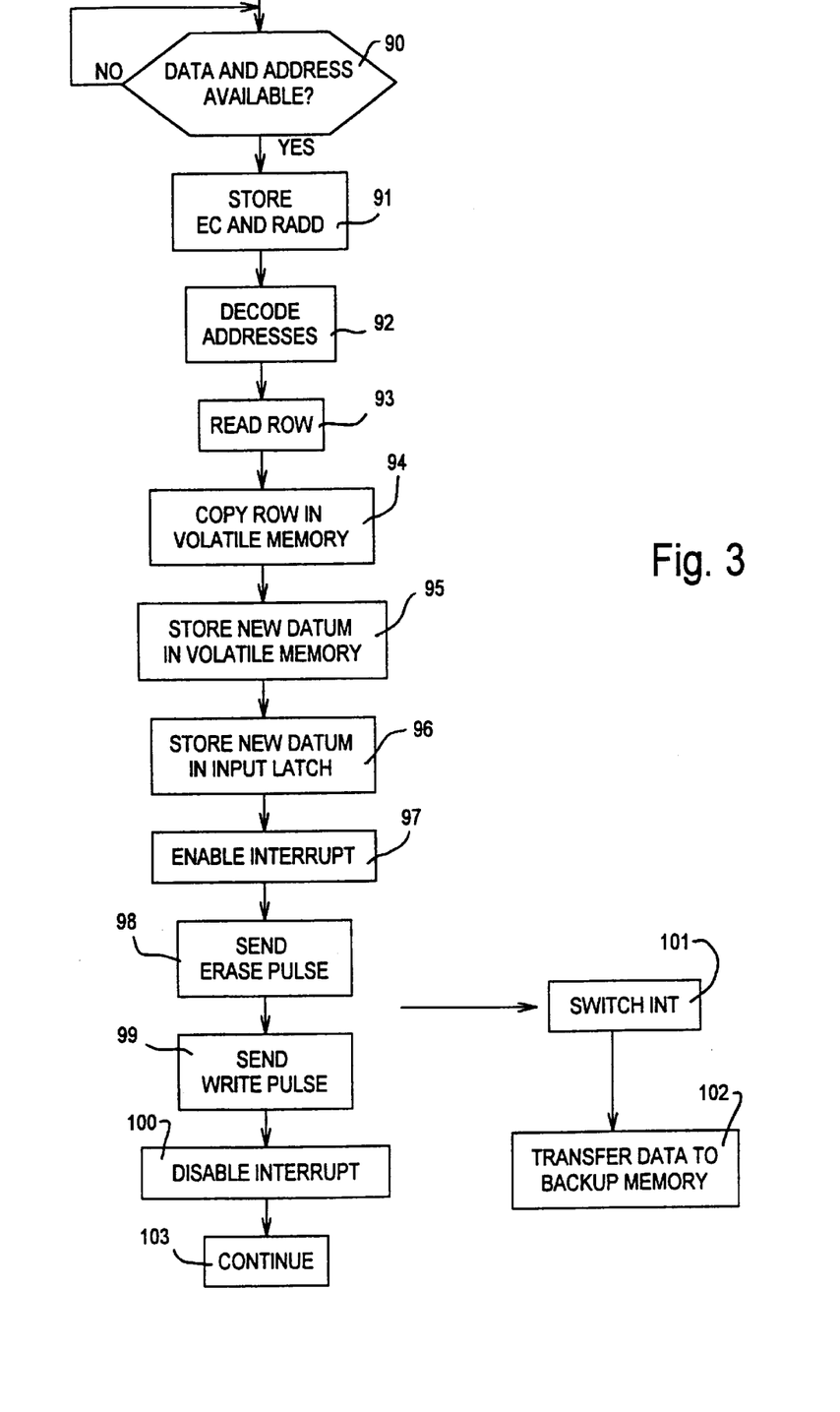
FIGS. 3 and 4 are flow charts regarding the present method.

FIG. 3 shows the flow chart relative to programming of memory 1. In detail, programming begins when pads 24 receive input data (to be written) and the pad 13 receives the corresponding addresses (YES output from block 90). In this condition, control logic unit 2 transmits appropriate control signals on lines 12a, 11a to address buffer 12 and to address latch 11; address latch 11 then supply the address signals RADD to row decoder 4 and to temporary memory 38 via buses 4a, 4b; in addition, control logic unit 2 supplies a value corresponding to logic state 1 of error code EC to temporary memory 38, which stores this value, together with signals RADD, in the appropriate latch circuit 70 in portions 38c and 38b (FIG. 2), block 91.

Control logic unit 2 then enables row decoder 4 and column decoder 5, such as to address the row of memory array where the datum to be programmed must be stored, block 92, and controls reading of this row, block 93. The content of the row which has just been read is transferred, via reading circuit 16, output latch 18, I/O buffers 19, row buffer 36 and bus 37, to temporary memory 38, which stores it, block 94. Then, control logic unit 2 controls transfer of the new datum to be programmed, from pads 24 to I/O buffer 19, and then to row buffer 36, to bus 37 and to temporary memory 38, which overwrites the new datum in latch circuits 70 corresponding to the addressed columns, wherein lines not to be altered are left floating, block 95. Thereby, now temporary memory 38 has stored in a volatile manner the new content of addressed row, the corresponding row address, and the error code.

Subsequently, control logic unit 2 controls transfer of a new datum from I/0 buffer 19 to input 26 and its latch, in a known manner, block 96, and enables interruption by voltage drop detector 33, block 97. Control logic unit 2 then starts the actual programming cycle, including transmitting the erasing pulse, block 98, and transmitting the write pulse, block 99. If during this cycle, no cycle-interrupting events occur, control logic unit 2 disables the interruption, block 100, and proceeds with successive operations, as planned by the program (block 103). During this step, row decoder 4 does not transmit any voltage on lines 42a, 42b, which are thus floating, keeping backup memory 39 in a deactivated condition.

On the other hand, if during erasing or writing, drop detector 33 detects a condition which prevents continuation of programming, and transmits error signal ERR, control logic unit 2 switches signals INT and INTH from high to low, causing deactivation of row regulator 7 and column regulator 8, to prevent incorrect addressing of memory array 3, and switching the operative state of auxiliary supply circuit 40, block 101. In detail, switching of INTH to low causes opening of switch 59, and thus disconnects storing unit 56 from charge pump 9, in order to prevent discharge of storing unit 56 to charge pump 9. Simultaneously, switching of INTH to low causes switching off of NMOS transistor 67; node 64, which is no longer connected to ground, is brought by resistor 65 to the voltage present at the high voltage output 57b of voltage divider 57. Consequently, biasing transistor 63 is switched on, and connects node 79 to high voltage output 57b. Simultaneously, row decoder 4, controlled by control logic unit 2, connects line 42b to ground, such that data previously stored in a volatile manner in latch circuits 70, including error code EC, is transferred to backup memory 39, block 102. By appropriately selecting the dimensions and number of storage capacitors 61, it is possible to guarantee completion of saving and permanent storing of data stored in a volatile manner, before auxiliary supply circuit 40 is switched off and discharged.

Figure 4:
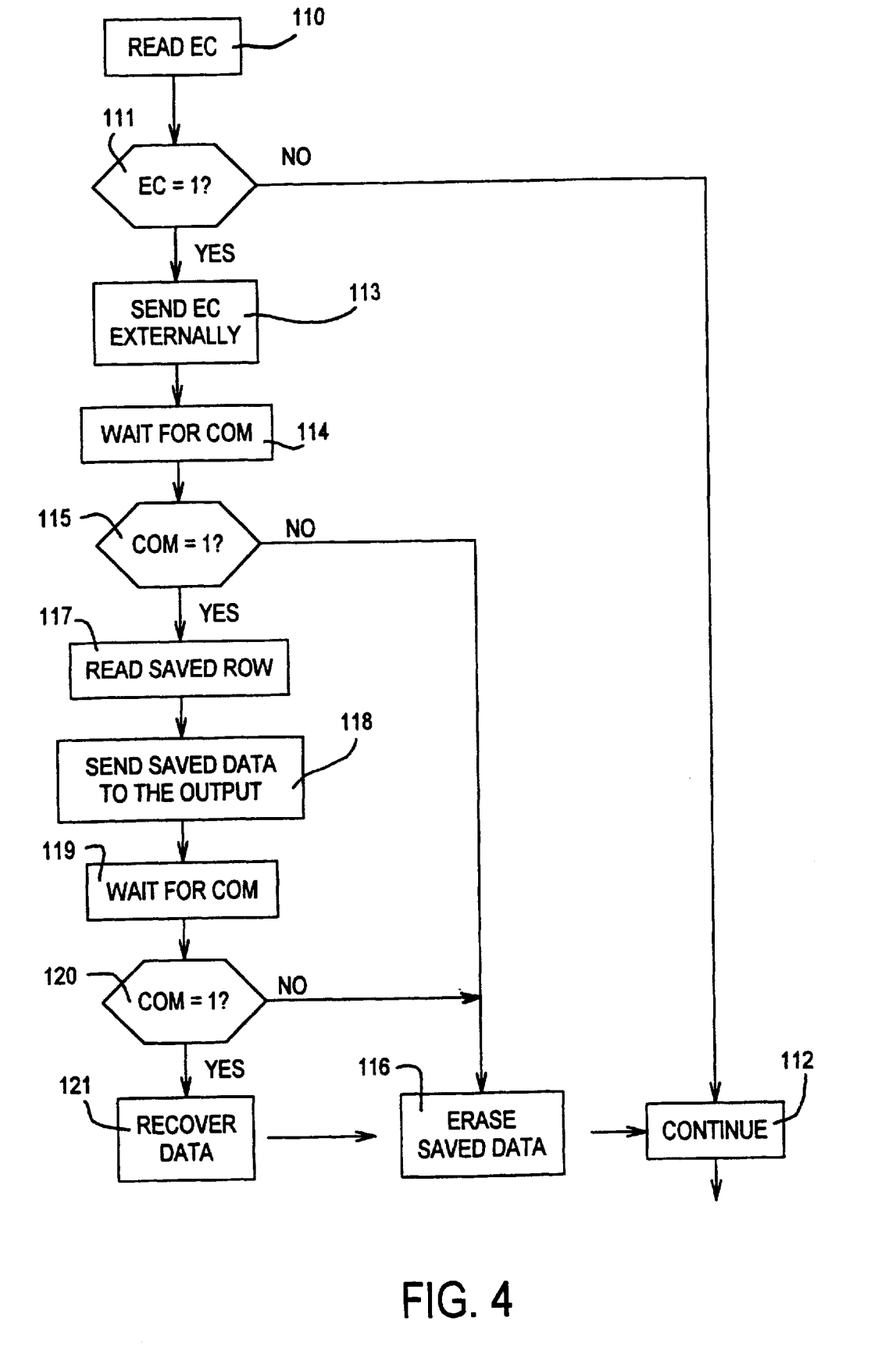

The flow chart in FIG. 4 relates to the operations of switching on memory 1 and recovering saved data. In detail, after memory 1 has been switched on, and lines are settled, control logic unit 2 starts reading of the content of memory portion 39c, and stores the state of error code EC, block 110. For this purpose, control logic unit 2 transmits appropriate control signals to row decoder 4, in order for the latter to bias lines 42a and 42b to a reading level, and to transmit an appropriate voltage on line 41, and acquires the reading results via line 49, from I/O buffers 19. As already stated, the state of error code EC is for example 0 if programming has not been interrupted unexpectedly before memory 1 is switched off, since the backup memory is normally erased, otherwise the state is 1.

If reading of error code EC indicates that there has not been any emergency backup during the previous switching off, NO output from block 111, the system continues with the planned operations, according to normal program, block 112. On the other hand if the output from block 1 is YES, control logic unit 2 controls transmission of error code CE to the output through pad 50, and sends a corresponding signal to line 48, block 113. Control logic unit 2 then waits for instructions from the external control system, for example a microcontroller (not shown), block 114. In the considered example, the external response includes a control COM having three states, a first state (for example COM=1) corresponding to recovery saved data; a second state (for example COM=2) corresponding to ignore the error condition, and a third state (for example COM=0) corresponding to a non-response condition from the exterior. When external control is received, for example at pad 31, or after a predetermined time when condition COM=0 persists, control logic unit 2 verifies whether control COM has a logic state which corresponds to the request for backup (i.e., if COM=1). If this is not true, NO output from block 115, control logic unit 2 controls erasure of backup memory 39 such that the latter is once again ready for any successive backup operations, block 116. For this purpose, control logic unit 2 controls row decoder 4, so that the latter transmits the correct biasing for erasing on lines 42a and 42b, and it also controls transmission of appropriate biasing voltages to the inputs of volatile memory 38, via I/O buffer 19, bus 35, row buffer 36 and bus 37. Control logic unit 2 then continues with the planned operations, block 112.

Otherwise, YES output from block 115, control logic unit 2 controls reading of data stored in backup memory 39, block 117. Read data is then supplied via bus 47, reading circuit 16 and output latches 18, to I/O buffers 19. Control logic unit 2 then controls transmission of read data to the exterior, via pads 24, to allow verification of this data by the external micro-controller, block 118.

Control logic unit 2 then waits again for a control from the external micro-controller, block 119. As before, this control signal can have three states, a first state (COM=1) corresponding to a request to recover datum saved in memory array 3, a second state (COM=2) corresponding to a request to ignore the saved datum (for example because the microcontroller prefers to resume programming from a predetermined known point), and a third state (COM=0) corresponding to a condition of non-response.

On receipt of the external control signal, or after a predetermined time during which the condition COM=0 persists, control logic unit 2 verifies whether control signal COM has a logic state which corresponds to the request for backup (i.e., whether COM=1). If this is not the case, NO output from block 120, control logic unit 2 controls erasing of backup memory 39, returning to block 116, otherwise it recovers read data in memory array 3. To this end, the address of the row the content whereof has been saved is supplied to row decoder 4 in a conventional manner, by means of a normal programming operation, the row addressed is erased in a usual manner, data present in I/O buffers 19 is supplied to input latches 20, and is written in memory array 3, in the addressed row, block 121.

On completion, backup memory 39 is erased, block 116, and the program continues normally.

According to an aspect of the invention, to guarantee programming of backup memory 39 simply by the charge accumulated in storing unit 56, capacitive connection between the control gate region and the floating gate region of memory transistor 77 is increased by making the floating gate region longer than in standard memory cells. This ensures that memory transistors 77 have a larger connection surface between floating gate and control gate, than that of the memory transistors of the remainder of the memory array 3, which thus improves efficiency of programming (increased extraction of electrons) on the basis of increased dimensions. However, since the increase in the area occupied concerns a single row of the memory array, this increase is negligible in relation to the overall dimensions of memory 1.

Figure 5:
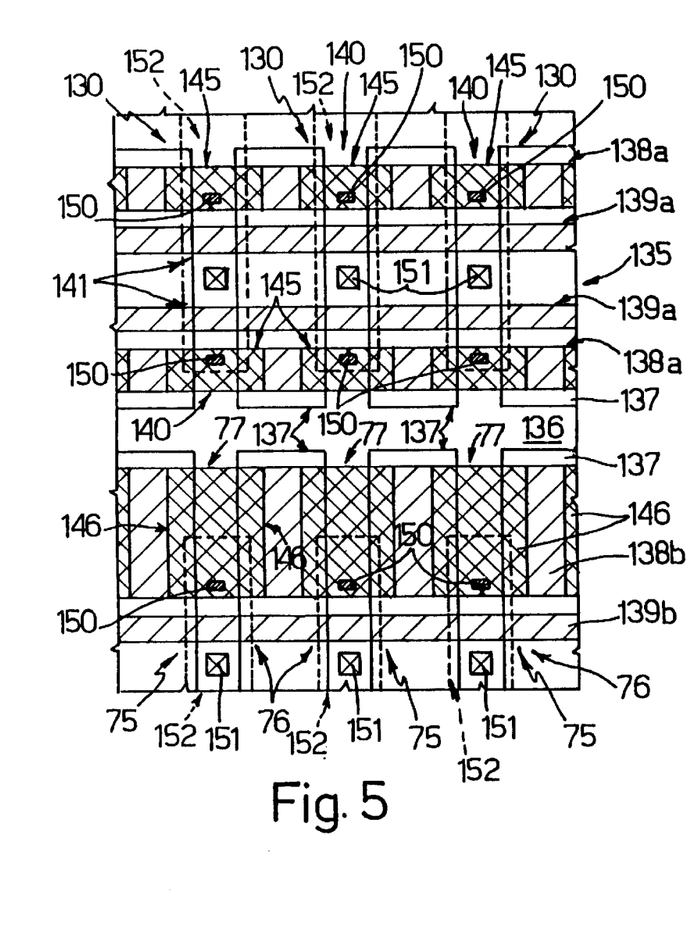
FIGS. 5 and 6 illustrate two different embodiments of an element of FIG. 2.

An example of the implementation of the backup cells 75 in case of EEPROM cells with double-polysilicon layers is shown in FIG. 5, and is described hereinafter. In detail, FIG. 5 shows a transparent view from above of regions forming memory cells 130 belonging to memory array 3, and of regions forming backup cells 75. In detail, a portion of a chip 135 of semiconductor material comprises active area regions 136 delimited by thick oxide regions 137.

Strips 138a, 138b and 139a, 139b of polycrystalline silicon (represented by the regions hatched with positive gradient lines) extend transversely to chip 135 in a horizontal direction; in particular, strips 138a represent control gate regions for memory transistors 140 of cells 130; strip 138b represents control gate regions for memory transistors 77 of backup cells 75; strips 139a represent control gate regions for selection transistors 141 of cells 130; and strip 139b represents control gate regions for selection transistors 76 of backup cells 75.

Below strips 138a, 138b, insulated regions of polycrystalline silicon are formed, which define floating gate regions 145 for memory transistors 140 of memory cells 130, and floating gate regions 146 for memory transistors 77 of backup cells 75; the floating gate regions are shown in the figure by negative gradient lines, and have a width which is the same as that of strips 138a, 138b. As can be seen, floating gate regions 146 and strip 138b are much wider than floating gate regions 145 and strips 138a (greater channel length), thus increasing the area of capacitive connection between the floating gate regions 146 and the respective control gate regions in backup cells 75.

Small squares 150 represent thin tunnel oxide regions, whereas small squares 151 represent drain contacts between active area regions 136 and bit lines 152, formed by strips of metal material, the edge of which is represented by a broken line.

Figure 6:
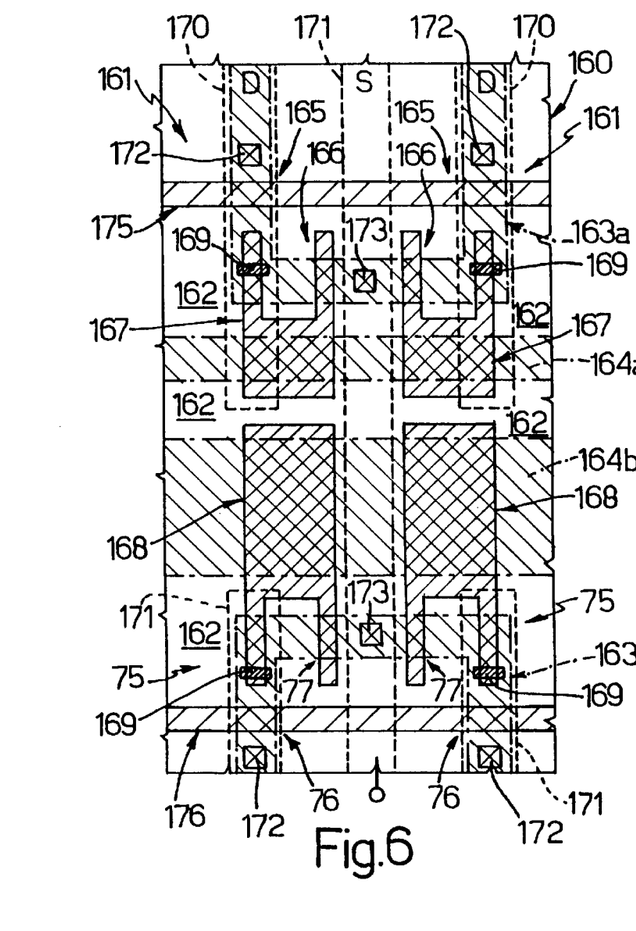

FIG. 6 shows a different embodiment, relative to a portion of a chip 160 comprising memory cells 161 (including selection transistors 165 and memory transistors 166) and backup cells 75 of the EEPROM type with a single polycrystalline silicon layer. In detail, in the example shown, chip 160 comprises thick oxide regions 162 surrounding active regions 163a, 163b, 164a and 164b, the outer edges of which are represented by dot and dash lines, and the areas of which are delimited by negative gradient lines. Active regions 163a and 163b, U-shaped, accommodate the conductive regions of selection transistors 165 and 76, and of memory transistors 166 and 77; active regions 164a and 164b comprise implanted strips forming control gate regions of selection transistors 165 and 76. In this case also, strip 164b is wider than strips 164a, to increase the capacitive connection with the floating gate regions, which here comprise polycrystalline silicon floating regions 167 and 168, which extend on the substrate and are insulated from the substrate by a gate oxide layer, in a known manner. Floating regions 167 and 168, relative respectively to memory cells 161 and backup cells 75, the areas of which are delimited in FIG. 6 by positive gradient lines, are U-shaped, with one arm of the U shape extending above a respective thin tunnel oxide area, represented by a rectangle 169, and the other arm extending above channel regions arranged between drain and source regions formed by active regions 163a, 163b in a known manner. On the same level as floating regions 167 and 168, polycrystalline silicon strips 175, 176 extend, which define respectively control gate regions of selection transistors 165 and 76. Bit lines 170 and source lines 171 (only one of which can be seen in the figure, corresponding to common ground line 78 in FIG. 2), the confines of which are represented by broken lines, are electrically connected to respective portions of active areas 163a, 163b, through small squares 172, 173, in a known manner.

The advantages of the described method and memory are the following. First, they solve the problem of loss of data being programmed in cases of occurrences (such as a supply drop), which prevent continuation of programming. For this purpose, an appropriate memory area is provided (which either belongs to the memory array itself, or is physically separated from the latter), which is kept erased such as to allow immediate writing of the datum being programmed; thereby it is possible to complete backup within shorter times than conventional programming methods. Implementation of the backup memory such as to increase writing efficiency helps the writing operations, and thus increases the possibility of actual backup.

Temporary prior storage of the datum which may need to be loaded in the backup memory allows a reduction to a minimum of the backup times and separation of the bit lines between the backup memory and the memory array, reduces over-burdening storing unit 56 from a capacitive point of view, when backup takes place.

The described implementation requires only a few modifications to the architecture and structure of the memory, and is simple and reliable.

Finally, it is apparent that many modifications and embodiments may be devised to the described and illustrated method and the memory, all of which come within the scope of the invention, as defined in the attached claims. In particular, it is emphasized that the described solution can also be applied to other nonvolatile memory types; if backup memory is produced separately from the memory array, it can also be of a different type from the memory array, and can be produced using different technology: improvement of writing efficiency in the backup memory can be obtained by enlarging the thin tunnel oxide region area, instead of by increasing the capacitive connection surface. In addition, the backup memory can be modified such as to provide, instead of simply the one-bit error code, a code with several bits that stores the stage at which interruption of the program occurred, for example before or after completion of erasing, at start or end of the writing step etc., to allow optional optimization of successive data recovery operations, or also to prevent these operations, if programming is at a sufficiently advanced stage.

Finally, particularly in case of a backup memory 39 separate from memory array 3, the latter can have an additional portion for storing the column addresses, and in this case, the backup memory stores only the new datum to be programmed.

What is claimed is:

1. A method for saving data of a nonvolatile memory having a memory array, comprising:
    detecting a programming interruption event;
    providing a separate supply for a backup memory unit when said event is detected; and
    loading said data to be programmed in said backup memory unit.

2. The method according to claim 1 wherein loading said data to be programmed comprises loading addresses of said data to be programmed in said backup memory unit.

3. The method according to claim 2 wherein loading said data to be programmed comprises loading programming interruption information in said backup memory unit.

4. The method according to claim 1, further comprising storing said data to be programmed in a first temporary memory unit connected to said memory array, and in a second temporary memory unit connected to said backup memory unit, and in that said step of loading said data to be programmed comprises the step of transferring data stored in said second temporary memory unit to said backup memory unit.

5. The method according to claim 4, comprising, before said step of storing, the steps of:
    loading an auxiliary supply unit with a backup programming voltage;
    acquiring addresses of said data to be programmed;
    loading said addresses and an error code in said second temporary memory unit;
    addressing a row of said memory array;
    reading data stored in said row; and
    loading said data stored in said second temporary memory unit, besides said addresses and said error code;
    wherein, in said step of storing, said data to be programmed is overwritten on said data stored in said second temporary memory unit.

6. The method according to claim 5, comprising after said step of detecting a programming interruption event, the steps of interrupting said step of loading said auxiliary supply unit and connecting said auxiliary supply unit to said backup memory unit.

7. The method according to claim 1, comprising the further steps of:
    switching on said nonvolatile memory;
    verifying presence of data saved in said backup memory unit;
    if saved data are present, reading said backup memory unit; and
    loading said data saved in said memory array.

8. A nonvolatile memory having a memory array, comprising:
    a programming voltage generator means connected to said memory array;
    detecting means for detecting a programming interruption event;
    a backup memory unit;
    auxiliary voltage generator means connected to said backup memory unit; and
    programming control means for said backup memory unit, activated by said detecting means.

9. The memory according to claim 8 wherein said backup memory unit is formed on a row of said memory array.

10. The memory according to claim 8 wherein said memory array comprises first memory elements including first charge accumulating regions having a first dimension, and said backup memory unit comprises second memory elements including second charge accumulating regions having a second dimension, said second dimension being greater than said first dimension.

11. The memory according to claim 8 wherein said backup memory unit is separated from said memory array.

12. The memory according to claim 8, further comprising a first temporary memory unit connected to said memory array and a second temporary memory unit connected to said backup memory unit, said second temporary memory unit being connected to said auxiliary voltage generator means.

13. The memory according to claim 12 wherein said second temporary memory unit comprises latch circuits.

14. The memory according to claim 8 wherein said auxiliary voltage generator means comprise an energy accumulation unit connected to said programming voltage generator means through a first switch element, and to said backup memory unit via a second switch element.

15. The memory according to claim 8 wherein said backup memory unit comprises a first portion for storing data to be programmed; a second portion for storing addresses of said data to be programmed; and a third portion for storing a code indicating that backup has taken place.

16. A method for saving data, comprising:
    storing a predetermined write voltage in an auxiliary voltage storage device;
    detecting a voltage supply drop and generating an error code signal;
    deactivating row address and column address regulators to main memory and activating the auxiliary voltage storage device in response to the error code signal; and
    transferring data to be saved to a backup memory.

17. The method of claim 16 wherein the data to be saved includes the error code signal.

18. The method of claim 16 wherein the data to be saved includes the error code signal and the addresses of the data to be saved.

19. The method of claim 16, comprising the initial step of providing a temporary memory and an erased backup memory, and wherein transferring data to be saved comprises transferring data from the temporary memory to the erased backup memory.

20. The method of claim 16, further comprising transferring saved data from the backup memory to main memory and erasing the backup memory.

21. The method of claim 16, further comprising:

detecting the presence of the error code signal in the backup memory and transferring data from the backup memory to the main memory when the error code signal is detected.

22. The method of claim 20, further comprising:

checking for the error code signal in the backup memory; and performing either of erasing saved data in the backup memory without transferring the saved data from the backup memory to the main memory, and transferring saved data from the backup memory to the main memory followed by erasing the saved data from the backup memory.

23. A method for saving and restoring data, comprising:

providing a temporary memory;

providing an erased backup memory;

providing an auxiliary voltage supply;

activating the backup memory in response to an interrupt signal;

transferring data to be saved from the temporary memory to the backup memory;

switching on a nonvolatile memory;

verifying the presence of saved data in the backup memory; and loading any saved data in the backup memory to the nonvolatile memory.

24. The method of claim 23 wherein providing an auxiliary voltage supply comprises storing a predetermined write voltage in a voltage storage device.

25. The method of claim 23 wherein activating the backup memory comprises detecting an interrupt signal and coupling the auxiliary voltage supply to the backup memory.

26. The method of claim 23 wherein activating the backup memory comprises:

detecting a voltage supply drop;

deactivating row address and column address regulators to the main memory; and coupling the auxiliary voltage supply to the backup memory.

27. A device for saving and restoring data to a main memory, the device comprising:

a backup memory configured to read and write data to be saved;

an auxiliary voltage supply device coupled to the backup memory;

a detector configured to detect a drop in supply voltage to the main memory and to generate an error code signal in response thereto; and control means configured to detect the error code signal, connect the auxiliary voltage supply to the backup memory and activate the backup memory to receive data to be stored, and to activate the backup memory to write saved data to the main memory when the main memory is switched on.

28. The device of claim 27, further including a temporary memory connected before the backup memory to read data and to write data to be saved to the backup memory, the temporary memory being coupled to the auxiliary voltage supply device.

29. The device of claim 27 wherein the backup memory is formed as part of the main memory.

30. The device of claim 27 wherein the backup memory is formed separate from the main memory.

* * * * *